US006981060B2

(12) United States Patent
Malm

(10) Patent No.: US 6,981,060 B2
(45) Date of Patent: Dec. 27, 2005

(54) COMPRESSION BASED ON CHANNEL CHARACTERISTICS

(75) Inventor: Peter Malm, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 745 days.

(21) Appl. No.: 09/735,495

(22) Filed: Dec. 14, 2000

(65) Prior Publication Data

US 2002/0107987 A1 Aug. 8, 2002

(51) Int. Cl.[7] .............................................. G06F 15/16
(52) U.S. Cl. ...................... 709/247; 709/246; 709/247; 714/746; 714/748
(58) Field of Search ................................ 709/247, 203, 709/246; 714/18, 48, 746–750, 748; 375/240, 375/242

(56) References Cited

U.S. PATENT DOCUMENTS

| | | | | |
|---|---|---|---|---|
| 4,589,111 | A | * | 5/1986 | Adachi ....................... 714/748 |
| 5,130,993 | A | * | 7/1992 | Gutman et al. ............. 714/775 |
| 5,450,453 | A | | 9/1995 | Frank |
| 5,550,756 | A | * | 8/1996 | Ohmi et al. ................ 709/247 |
| 5,675,703 | A | * | 10/1997 | Sato ............................ 375/240 |
| 5,881,104 | A | * | 3/1999 | Akahane ..................... 375/240 |
| 6,058,459 | A | * | 5/2000 | Owen et al. ................ 709/247 |
| 6,137,784 | A | | 10/2000 | Wallerius et al. |
| 6,247,150 | B1 | * | 6/2001 | Niemela ..................... 714/748 |
| 6,347,124 | B1 | * | 2/2002 | Antia et al. ................. 714/780 |
| 6,366,545 | B2 | * | 4/2002 | Koyata .................... 369/59.16 |
| 6,400,928 | B1 | * | 6/2002 | Khullar et al. ............. 375/242 |
| 6,668,089 | B1 | * | 12/2003 | Bracamonte et al. ....... 382/239 |
| 6,711,709 | B1 | * | 3/2004 | York .......................... 714/748 |
| 6,718,507 | B1 | * | 4/2004 | Johnston et al. ........... 714/746 |
| 6,744,766 | B2 | * | 6/2004 | Alapuranen ................ 370/394 |

FOREIGN PATENT DOCUMENTS

| | | |
|---|---|---|
| EP | 0 771 092 | 2/1997 |
| WO | 99/22481 | 5/1999 |

OTHER PUBLICATIONS

Timothy C. Bell et al., "The Relationship between Greedy Parsing and Symbolwise Text Compression", Journal of the Association for Computer Machinery, vol. 41, No. 4, Jul. 1994, pp. 708-724.
Jeffrey Scott Vitter et al., "Optimal Prefetching via Data Compression", Journal of the ACM, vol. 43, No. 5, Sep. 1996, pp. 771-793.
Joachim Hagenauer et al., "A Viterbi Algorithm with Soft-Decision Outputs and its Applications,", in Proc. Globecom, Dalles, TX, Nov. 1989, pp. 1680-1686.

* cited by examiner

*Primary Examiner*—Ario Etienne
*Assistant Examiner*—Ramy M. Osman
(74) *Attorney, Agent, or Firm*—Potomac Patent Group PLLC

(57) ABSTRACT

In a packet based data transmission including automatic repeat request (ARQ) protocols, the memory consumption of the ARQ protocol is reduced by compression/decompression of failed data block prior to combination with the retransmitted data blocks using low complexity compression/decompression algorithms. The compression algorithm includes of two parts: calculating and storing a scale factor that estimates the soft values in the data block, and storing the each soft values' sign in local memory instead of the complete soft value. Since one bit is sufficient to store the sign of each soft value, the memory consumption of a data block containing N soft values is N bits. Note, the scale factor increases the memory consumption, in bits, with the word length of the scale factor. However, the relative memory increase becomes smaller the larger the data block.

17 Claims, 2 Drawing Sheets

COMPRESSION BASED ON CHANNEL CHARACTERISTICS

FIELD OF THE INVENTION

The invention relates to communication systems, and more particularly to techniques for compressing received data in a communication system.

BACKGROUND

Packet-based data transmission is becoming increasingly popular in communication systems including land-mobile radio networks. Packet transmission opens up the possibility of improving the user's throughput by retransmitting failed data packets. Several different retransmission protocols, all based on automatic repeat request (ARQ), offer this functionality. In ARQ based protocols, when a data block fails channel decoding, it is usually stored in a local memory in the receiver. Then, upon retransmission of the data block, the retransmitted data block is combined with the failed data block previously stored in memory.

The size of the memory within a mobile terminal is preferably minimized due to the power consumption associated with large amounts of memory. Thus, a small amount of memory prolongs the operational time of the mobile terminal. Therefore, in order to provide for the advantages of packet data transmission in mobile radio networks, it is crucial to minimize the memory consumption of an ARQ protocol that includes the combination of failed and retransmitted data blocks.

One way of reducing the memory-size is to compress the symbols in the stored data blocks. Each received data block consists of a large number of symbols, and each symbol is represented in the receiver by a bit-vector of length L. Compression enables each symbol to be represented by a bit-vector of shorter length K, where K<L, which, in turn, results in a smaller memory size in the receiver.

A compression algorithm must be complemented with a decompression algorithm; however, the combination of compression/decompression algorithms may lead to increased implementation complexity. Consequently, the electrical power saved as a result of using a smaller memory may be wasted if highly complex compression/decompression algorithms are used.

Accordingly, a need exists for a method of reducing the memory consumption of stored data without adding complex compression/decompression algorithms.

SUMMARY OF THE INVENTION

As a solution to the above-described problem, the invention, according to exemplary embodiments, provides techniques for compressing stored data using compression/decompression algorithms with low complexity.

According to exemplary embodiments, data blocks are compressed by storing a scale factor, which estimates the soft values within the data block, and a vector representing the sign of each soft value within the data block. Decompression of the data block is achieved by multiplying the scale factor by the sign vector.

It shall be emphasized that the term "comprises/comprising" when used in this specification is taken to specify the presence of stated features, integers, steps or components but does not preclude the presence or addition of one or more other features, integers, steps, components or groups thereof.

BRIEF DESCRIPTION OF THE DRAWINGS

The objects and advantages of the invention will be understood by reading the detailed description in conjunction with the drawings, in which.

DETAILED DESCRIPTION OF THE INVENTION

Figure 1:
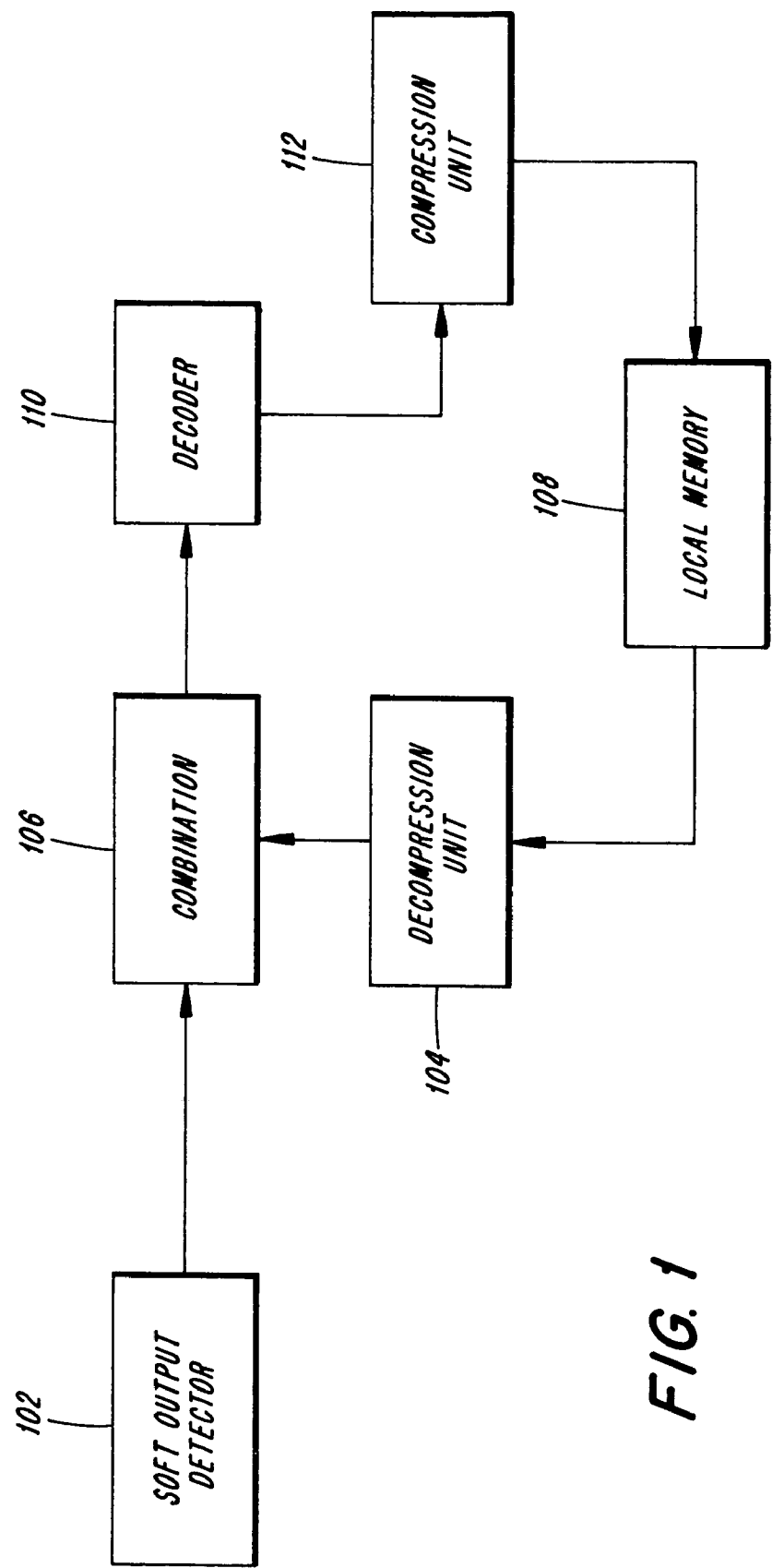
FIG. 1 shows a block diagram of the receiver chain according to an embodiment of the invention.

The various features of the invention will now be described with respect to the figures, in which like parts are identified with the same reference characters.

In the following description, for purposes of explanation and not limitation, specific details are set forth, such as particular steps, algorithms, techniques, circuits and the like, in order to provide a thorough understanding of the invention. However, it will be apparent to one of ordinary skill in the art that the invention may be practiced in other embodiments that depart from these specific details. In other instances, detailed descriptions of well-known methods, devices, and circuits are omitted so as not to obscure the description of the invention with unnecessary detail.

These and other aspects of the invention will now be described in greater detail in connection with a number of exemplary embodiments. To facilitate an understanding of the invention, many aspects of the invention are described in terms of sequences of actions to be performed by elements of a computer system or apparatus. It will be recognized that in each of the embodiments, the various actions could be performed by specialized circuits, by program instructions being executed by one or more processors, or by a combination of both. Moreover, the invention can additionally be considered to be embodied entirely within any form of computer readable storage medium having stored therein an appropriate set of computer instructions that would cause a processor to carry out the techniques described herein. Thus, the various aspects of the invention may be embodied in many different forms, and all such forms are contemplated to be within the scope of the invention.

FIG. 1 shows a block diagram of the receiver chain according to an exemplary embodiment of the invention. The soft output detector 102 employs a soft output Viterbi algorithm (SOVA) such as that described by J. Hagenauer and P. Hoeher, "A Viterbi algorithm with soft-decision outputs and its applications", in Proc. Globecom, Dallas, Tex., November 1989, pp 1680–1686, which is hereby incorporated herein by reference in its entirety. Thus, the output of the soft output detector 102 is in the form of soft values for each individual received bit. In the exemplary embodiment, each soft value is in the form of the log of the ratio of the probability that the received bit represents a particular values versus the probability that it represents a different value. For example, the ratio may be the probability that the bit is a zero over the probability that the bit is a one. The soft values generated by the soft output detector 102 are fed to the combination unit 106, where soft values from retransmitted data blocks are combined with stored soft values of the previously failed data block (i.e., a retransmitted data block is combined with its associated failed data block). Where, as in this example, the likelihood values represented by the soft values are scaled logarithmically, the form of the combination can be addition, which results in another likelihood value. Where logarithmic scaling is not used, the likelihood values should instead be combined by means of multiplication. For still other forms of soft values, different methods of combination can be used. The particular form of combination is not an essential aspect of the invention.

The combined soft values are then fed to the decoder 110, which decodes the channel code and outputs the estimated transmitted bit-sequence. In packet-based transmission systems, the data blocks include some sort of error detection bits, such as cyclic redundancy check (CRC) or parity bits. The decoder 110, uses the error detection bits to determine if the decoded data block includes any errors. If it is concluded that the block contains errors, retransmission of the erroneous data block is requested in accordance with the applicable ARQ protocol and the erroneous data block is compressed and stored in memory for later use.

The erroneous data blocks (herein referred to as "failed data blocks") are fed to the compression unit 112, wherein they are compressed and stored in local memory 108. When a retransmitted data block arrives it is combined with the corresponding failed data block which, before combination, has been retrieved from local memory 108 and decompressed by a decompression unit 104.

According to an exemplary embodiment of the invention the compression unit 112 and decompression unit 104 rely on two assumptions: that the channel is constant during the transmission of a whole data block, and that decompressed data blocks are combined with retransmitted data blocks before a new channel decoding is attempted. The latter assumption directly applies to several known ARQ protocols.

The compression algorithm according to an exemplary embodiment of the invention has two important parts. First, a scale factor is calculated which estimates the soft values in a data block. The scale factor can, for example, be the average value of the soft values in a data block. Second, each soft value's sign is stored (e.g., in the local memory) instead of the complete soft value. Since one bit is sufficient to store a soft value's sign, the memory consumption for a data block with N soft values is N bits. The scale factor is also stored, preferably with high accuracy, in the local memory. This increases the memory consumption, in bits, with the word length of the scale factor. However, the relative memory increase attributable to storage of the scale factor becomes smaller as the size of the data block increases.

The decompression algorithm according to an exemplary embodiment of the invention multiplies the stored vector of soft value signs by the accompanying scale factor. This is suitable for use in a mobile receiver because it is a simple operation in a digital signal processor that does not add much complexity. The decompressed data block is then ready for use, such as by combining it with a retransmitted data block before a new channel decoding attempt is made.

In receivers of the type described above, the compression/decompression algorithm may incur a small penalty in user data throughput. However, the advantage of the invention is the steep decrease in memory consumption compared to the uncompressed data blocks. The memory compression is roughly proportional to the inverse of the number of bits that represent an uncompressed symbol.

Assuming that the fading channel and the interference are both constant during the transmission of a data block, the signal-to-interference and noise ratio (SINR) is constant for a whole data block. This assumption is valid for many land mobile radio scenarios which suffer fading and interference. One consequence of a constant SINR is that the received absolute values of the soft values in a data block will be in the same range. This property is used to compress the soft values in a simple and efficient way.

For example, assume that a data block that has failed channel decoding consists of N soft values. The compression algorithm calculates one scale value $\alpha$ that serves as an estimate of all soft values in a data block. This scale value could, for example, be the absolute average of the soft values in a block. However, the use of an absolute average calculation is not an essential feature of the invention. Other scale value calculations may be used in alternative embodiments since it is the channel decoder that determines how the scale value should be calculated to obtain optimal performance.

The compression basically involves storing the soft values' signs only. Assume, for example, that the following data block with N soft values has been received $$\underline{s}=[s_1, s_2, \ldots, s_N] \qquad (1)$$

where $s_1$ is the first soft value in the block and so forth. The scale value $\alpha$ is a function $f()$ of the received soft values, $$\alpha = f(\underline{s}). \qquad (2)$$

An example of a suitable function could be the absolute average, $$f(\underline{x}) = \frac{1}{N}\sum_{k=1}^{N} |x_k|. \qquad (3)$$

The compressed data block to be stored in the local memory is now generated as $$\underline{c} = \left[\frac{s_1}{|s_1|}, \frac{s_2}{|s_2|}, \ldots, \frac{s_N}{|s_N|}\right] \text{ if } s_k \neq 0, 1 \leq k \leq N, \qquad (4)$$

or else, $c_k=0$ if $s_k=0$. The vector $\underline{c}$ hence consists of the soft values' signs. The memory consumption of $\underline{c}$ is only N bits since each compressed soft value is represented by its sign, and since the sign is binary and can be represented with only one bit.

However, the scale values must also be stored in the memory since they are needed during decompression. The decompression is basically a multiplication of the stored data block $\underline{c}$ with the accompanying scale factor. Thus, $$\hat{\underline{s}} = \alpha \underline{c} = \alpha[c_1, c_2, \ldots, c_N], \qquad (5)$$

is the decompressed data block. The decompressed block is combined with a retransmitted data block, and the resulting combination is supplied to the decoder 110.

Figure 2:
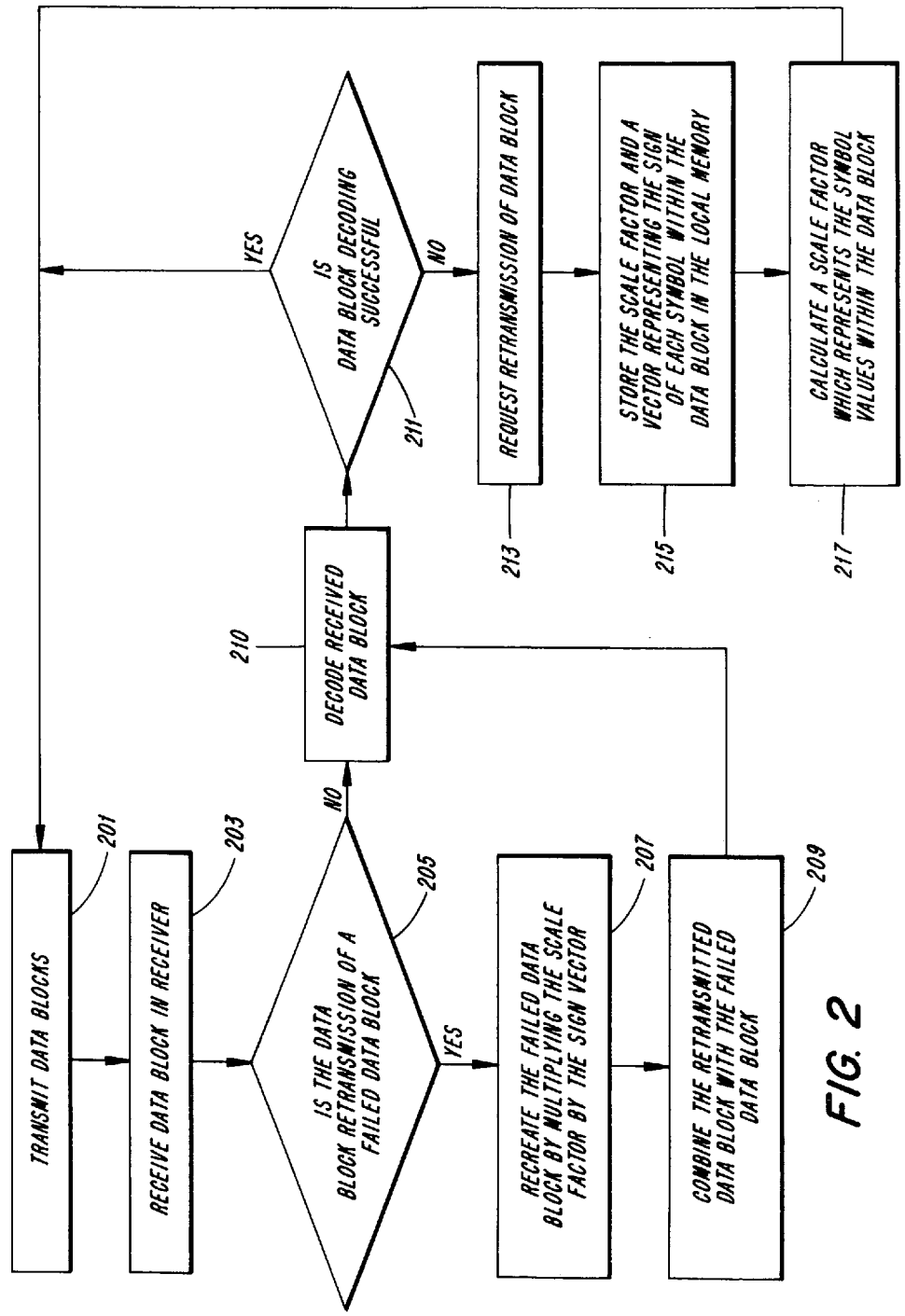
FIG. 2 shows a flow chart describing a data compression technique according to an exemplary embodiment of the invention.

FIG. 2 shows a flow chart describing an exemplary use of the inventive compression and decompression technique as applied to failed data blocks in a communications system receiver. As illustrated in FIG. 2, data blocks are transmitted (step 201), and received by the receiver (step 203). If the data block is not a retransmission of a previously transmitted data block ("NO" path out of decision block 205), the data block is fed to the decoder (step 210). If the data block fails the decoding process ("NO" path out of decision block 211), control flows to step 213 wherein a request for retransmission of the data block is initiated. Then, the failed data block is compressed as illustrated in steps 215 and 217. At step 215, a scale factor is calculated which represents the soft values within the failed data block. Control then proceeds to step 217, wherein the scale factor and a vector representing the sign of each soft value within the failed data block is stored in the local memory of the receiver.

If, at step 205, the data block is a retransmission of a previously failed data block ("YES" path out of decision block 205), then control proceeds to step 207. At step 207, the associated failed data block, which has been compressed and stored in local memory, is retrieved from the local memory and decompressed. Decompression is achieved by multiplying the scale factor by the sign vector for the failed data block. Control then proceeds to step 209, wherein the retransmitted data block and the failed data block are combined. Control then proceeds back to step 210, wherein the combined data block is then fed to the decoder.

The invention has been described with reference to particular embodiments. However, it will be readily apparent to those skilled in the art that it is possible to embody the invention in specific forms other than those of the preferred embodiments described above. This may be done without departing from the spirit of the invention.

For example, the foundation of the method described above is the representation of all soft values in a data block with one soft value. This requires that the SINR be constant over a whole data block. However, the method can be extended to handle a SINR that varies over a data block if the SINR is piecewise constant over the duration of the data block. The data block can then be divided into a number of sub-blocks each with constant SINR. Then each sub-block can be represented by a specific scale value $\alpha_i$ where index i denotes the sub-block number. The method for compression/decompression of each sub-block is then identical to the method described above.

The memory use increases when data blocks are divided into sub-blocks because each sub-block has a unique scale value which also must be stored in the memory. However, a mobile receiver may adaptively divide data blocks into sub-blocks based on a piecewise constant SINR. An adaptive algorithm is beneficial because the compression algorithm then follows the channel and interference characteristics, and overhead in terms of unnecessary scale values are avoided. However, adaptivity requires that the receiver be able to measure the SINR over parts of a data block. Several such SINR measuring algorithms are known. Note also that this extension is fully scalable down to the case in which each soft value is being stored, that is, the case in which there is no compression of the soft values.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A method of reducing the memory consumption of a retransmission scheme, the method comprising:
   transmitting information to a receiver in the form of data blocks using packet-based transmission;
   decoding the received data blocks;
   compressing failed data blocks, wherein a failed data block is a data block that fails the decoding process;
   storing the compressed failed data blocks;
   decompressing the failed data blocks;
   combining a decompressed failed data block with an associated retransmitted data block; and
   decoding the combined data block.

2. The method according to claim 1, wherein compressing failed data blocks comprises:
   calculating a scale factor that represents soft values within the failed data block; and
   storing the scale factor and a sign of each soft value within the failed data block in memory.

3. The method according to claim 2, wherein said scale factor is an average of absolute values of the soft values in the failed data block.

4. The method according to claim 2, wherein decompressing the failed data block comprises: multiplying the scale factor by the stored soft value signs.

5. The method according to claim 2, wherein said soft values are logarithmically scaled values.

6. The method according to claim 5, wherein combining a decompressed failed data block with an associated retransmitted data block comprises:
   adding the values of the retransmitted data block and the decompressed values of the failed data block.

7. The method according to claim 2, further comprising:
   dividing the data blocks into a plurality of sub-blocks, wherein each sub-block is characterized by a substantially constant signal-to-interference and noise-ratio;
   calculating a plurality of scale factors, wherein each scale factor represents soft values within a corresponding sub-block; and
   storing the plurality of scale factors and a sign of each soft value within the failed data block in memory.

8. A receiver for receiving packet based data transmissions, the receiver comprising:
   a soft output detector;
   a decoder;
   local memory;
   logic that compresses failed data blocks and stores the compressed failed data blocks in said local memory;
   logic that decompresses a compressed failed data block stored in said local memory; and
   logic that combines said decompressed data block with an associated retransmitted data block.

9. The receiver according to claim 8, further comprising:
   logic that calculates a scale factor that represents soft values within the failed data block; and
   logic that stores the scale factor and a sign of each soft value within the failed data block in memory.

10. The receiver according to claim 9, wherein said scale factor is an average of the absolute values of the soft values in the failed data block.

11. The receiver according to claim 9, further comprising:
    logic that multiplies the scale factor by the stored soft value signs.

12. The receiver according to claim 9, wherein said soft values are logarithmically scaled values.

13. The receiver according to claim 12, wherein the logic that combines the decompressed failed data block with the associated retransmitted data block comprises:
    logic that adds the values of the retransmitted data block and the decompressed values of the failed data block.

14. The receiver according to claim 8, further comprising:
    logic that divides the data block into a plurality of sub-blocks, wherein each sub-block contains a constant SINR;
    logic that calculates a plurality of scale factors, wherein each scale factor represents soft values within a corresponding sub-block; and
    logic that stores the plurality of scale factors and a sign of each soft value within the failed data block in memory.

15. A method of processing data blocks within a receiver of a communications system, comprising:
   receiving a data blocks in the receiver;
   calculating a scale factor that represents soft values within the received data block;
   storing the scale factor and a representation of each soft value within the data block in memory, the representation indicating only a sign of each soft value within the received data block;
   generating a decompressed data block by decompressing the scale factor and the representation of each soft value within the data block stored in memory; and
   combining the decompressed data block with an associated retransmitted data block.

16. The method according to claim 15, wherein said soft values are logarithmicaily scaled values.

17. A method of compressing data blocks within a receiver of a communications system, comprising:
   receiving a data block in the receiver;
   calculating a scale factor that represents soft values within the received data block; and
   storing the scale factor and a sign of each soft value within the data block in memory;
   dividing the data blocks into a plurality of sub-blocks, wherein each sub-block is characterized by a substantially constant signal-to-interference and noise-ratio;
   calculating a plurality of scale factors, wherein each scale factor represents soft values within a corresponding sub-block; and
   storing the plurality of scale factors and a sign of each value within the data block in memory.

* * * * *

UNITED STATES PATENT AND TRADEMARK OFFICE
CERTIFICATE OF CORRECTION

PATENT NO. : 6,981,060 B2  
APPLICATION NO. : 09/735495  
DATED : December 27, 2005  
INVENTOR(S) : Peter Malm Page 1 of 1

It is certified that error appears in the above-identified patent and that said Letters Patent is hereby corrected as shown below:

Col. 4, line 50, change the formula from:

$$\hat{\underline{s}} = \alpha \underline{c} = \alpha[c_1, c_2, ..., c_N], \quad (5)$$
$$\text{to} -- \hat{\underline{s}} = \alpha \underline{c} = \alpha[c_1, c_2, ..., c_N], \quad (5)--$$

Col. 7, line 3, change "blocks" to --block--  
line 16, change "logarithmicaily" to --logarithmically--

Signed and Sealed this

Fourteenth Day of November, 2006

JON W. DUDAS  
*Director of the United States Patent and Trademark Office*